United States Patent [19]

Janssen

[11] Patent Number: 5,404,726
[45] Date of Patent: Apr. 11, 1995

[54] CRYOSTAT WITH MECHANICALLY FLEXIBLE THERMAL CONTACTING

[75] Inventor: Volker Janssen, Langnau, Switzerland

[73] Assignee: Spectrospin AG, Faellanden, Switzerland

[21] Appl. No.: 109,304

[22] Filed: Aug. 19, 1993

[30] Foreign Application Priority Data

Aug. 19, 1992 [DE] Germany ............ 42 27 388.9

[51] Int. Cl.6 .................................. F25D 3/10
[52] U.S. Cl. ..................... 62/51.1; 62/50.7; 62/295; 62/297; 62/51.3
[58] Field of Search ........... 62/50.7, 51.1, 51.3, 62/295, 297

[56] References Cited

U.S. PATENT DOCUMENTS

| | | | |
|---|---|---|---|
| 3,122,004 | 2/1964 | Aberle et al. | 62/51.1 X |
| 3,176,473 | 4/1965 | Andonian | 62/51.1 |
| 3,364,687 | 1/1968 | Kolm | 62/51.3 |
| 4,633,682 | 1/1987 | Laskaris | 62/51.1 |
| 4,655,045 | 4/1987 | Matsumoto et al. | 62/51.1 |
| 4,782,671 | 11/1988 | Breneman et al. | 62/51.3 |
| 5,201,184 | 4/1993 | Roth | 62/51.1 X |

FOREIGN PATENT DOCUMENTS

2906060C2  8/1979  Germany .

OTHER PUBLICATIONS

H. Brechna, "Superconducting Magnet Systems", Springer–Verlag Berlin, 1973, 5 pages.

Primary Examiner—Christopher Kilner
Attorney, Agent, or Firm—Flynn, Thiel, Boutell & Tanis

[57] ABSTRACT

A cryostat (1) in particular for the acceptance of a superconducting magnet coil (2) for NMR or ICR measurements, exhibits a central vessel (3) for fluid helium which by means of holding means (4), preferentially thin-walled suspension tubes, is mechanically connected to, preferentially is suspended from, the inside of a closed outer jacket (5) of the cryostat (1) whereby the holding means (4) are in good thermal contact, via good thermally conducting tube-shaped connecting elements (6) which completely surround the holding means (4), with a shell (7) surrounding a central vessel (3), the shell (7) being held, in particular, at the temperature of liquid nitrogen, and the thermally good conducting tube-shaped connecting elements (6) being configured to be mechanically flexible. In this fashion, the central vessel (3) is mechanically decoupled from the shell (7) which is thermally connected to the holding means (4) of the central vessel (3). In this fashion, when the shell (7) is tipped, a motion of the central vessel (3) in particular of the magnet coil (2) located therein is avoided. (FIG. 1b)

14 Claims, 3 Drawing Sheets

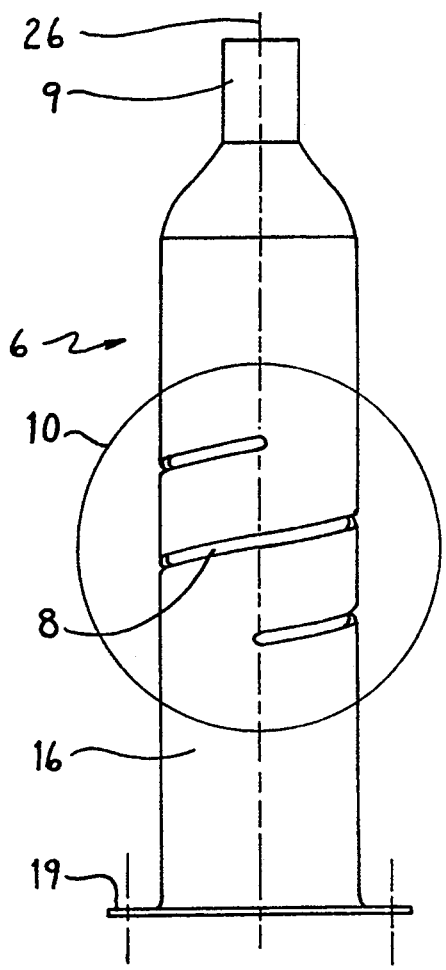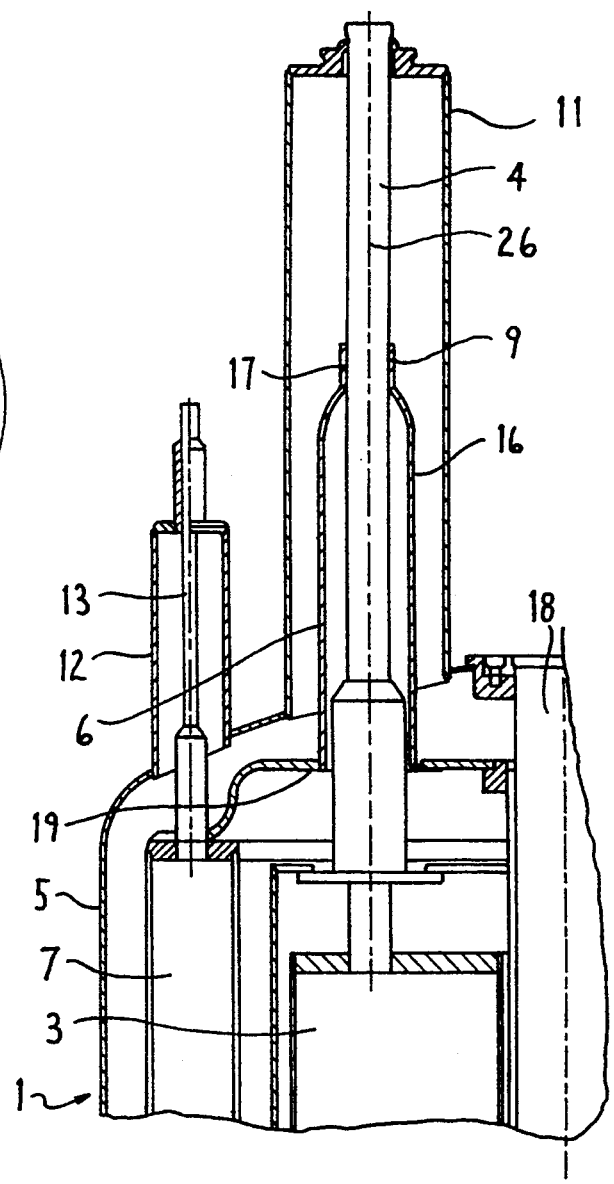
FIG.1b
FIG.1a

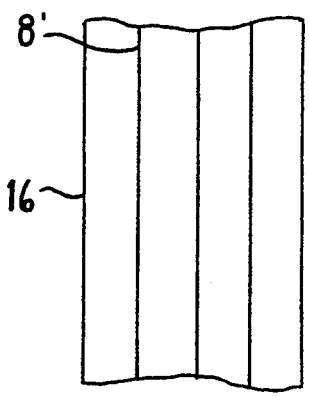
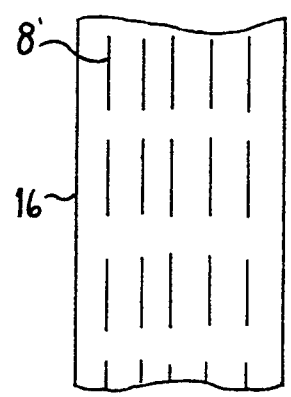
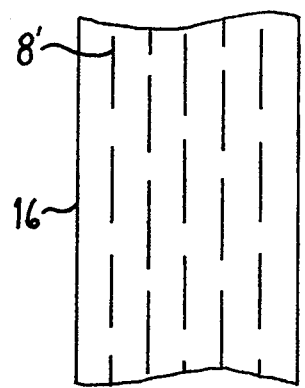
FIG.3a     FIG.3b     FIG.3c
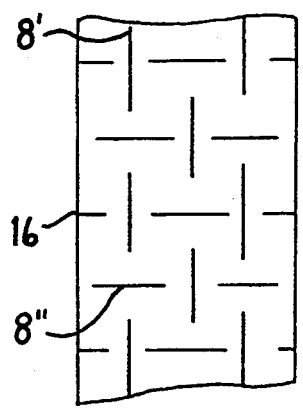
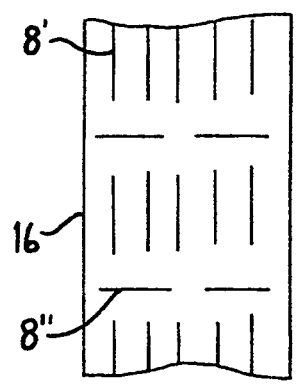
FIG.3d     FIG.3e
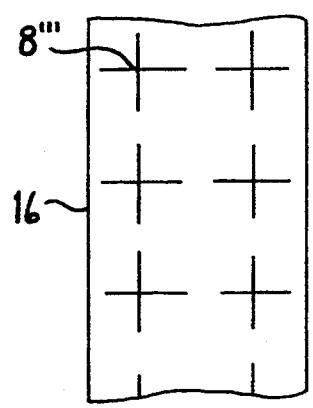
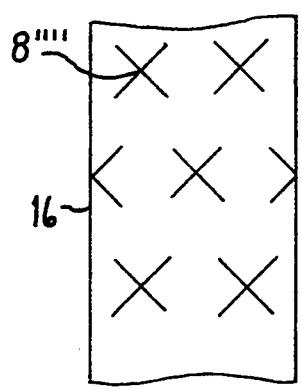
FIG.3f     FIG.3g

CRYOSTAT WITH MECHANICALLY FLEXIBLE THERMAL CONTACTING

BACKGROUND OF THE INVENTION

The invention concerns a cryostat, for the acceptance of a superconducting magnet coil for, nuclear spin resonance (NMR) or ion cyclotron resonance (ICR) to measurements. A central vessel for a cryogenic fluid such as liquid helium, which using holding means preferentially comprising thin-walled suspension tubes, is mechanically connected to, or suspended from, the inner side of a closed outer jacket of the cryostat, whereby the holding means is in good thermal contact with a shell surrounding the central vessel via good thermally conducting tube-shaped connecting elements which completely surround the holding means. The shell is maintained at the temperature of a second cryogenic fluid, such as liquid nitrogen, whose boiling temperature is higher than the boiling temperature of the fluid in the central vessel.

A cryostat of this kind is, by way of example, known from DE 29 06 060 C2.

In constructing a cryostat, thermal contact is often required which exercises as small a mechanical force as possible on the remaining components. For example, it is customary with cryostats for NMR-magnets, to suspend the shell containing the liquid nitrogen using three thin-walled steel tubes equally spaced around the circumference for fastening it to the inside of the outer jacket of the crycstat. Such a suspension is statically defined and leads to no particular problems. In addition, it is necessary to assure that the nitrogen vessel be in thermal contact with both thin-walled steel suspension tubes of the fluid helium containing central vessel in order to achieve better thermal separation of the helium vessel from the temperatures (approx. 300° Kelvin) present in the outer region of the cryostat.

The contact elements between the suspension elements of the helium vessel and its surrounding liquid nitrogen containing shell were, in prior art, normally relatively rigid. In the above mentioned publication, the suspension tubes, which simultaneously serve as venting and filling tubes for the helium vessel, are fastened to connecting tubes by means of rigid aluminium heat transfer collars, the connecting tubes being closed on all sides, thermally conducting, and coaxial to the suspension tubes and, on their other end, are in thermal contact with the liquid nitrogen vessel so that they are largely at the temperature of liquid nitrogen.

This mechanically rigid thermal contacting can lead to a statically undefined mechanical state when cooling the cryostat to the temperature of liquid nitrogen or liquid helium due to the thermal stresses which thereby occur and which must be compensated for by the remaining elasticity of the mechanical components.

As long as the liquid nitrogen containing vessel is symmetrically constructed and the suspension elements (as a rule three) are evenly cooled down, it is possible for the nitrogen vessel to be displaced only in the direction of the suspension elements, that is to say, upward or downward.

Therefore no sideward displacements takes place and, consequently, no disruptions of the available axial symmetry of the crycstat assembly occurs. As a result, both connecting arrangements between the liquid nitrogen vessel and the thermal contacts on both steel tube suspension elements can only transfer forces in a vertical direction of approximately equal magnitude, onto both steel tubes of the helium vessel suspension. The helium vessel can thereby only be displaced vertically by a small amount due to the extremely strong mechanical rigidity of the two steel tubes in this direction. This situation is therefore, in general, not critical.

The situation changes, however, when the three suspension tubes of the nitrogen vessel are not cooled down evenly. In this case the lengths of the three suspension elements change differently and the nitrogen vessel experiences a sideward displacement which, by means of the two connections to the thermal contacts, can be transferred to the helium vessel. The two helium vessel suspension tubes cannot deliver a sufficiently large reaction force against this sideward displacement so that the helium vessel experiences nearly the same sideward displacement as the nitrogen vessel. However, along with the displacement of the helium vessel, this results in a displacement of the center of the cryomagnet coil located therein relative to the stationary measurement sample within the central room temperature bore of the cryostat. The measurement sample thereby experiences a field change which disadvantageously influences the NMR-spectrum and requires at least a new "shimming" of the field. This procedure depends, disadvantageously, on the height of the fluid level of the nitrogen, or more precisely, on the actual weight of this liquid.

The liquid nitrogen vessel suspension tubes cannot normally be cooled down evenly since, for safety reasons, one of the tubes must always, be equipped with an overpressure valve. It is therefore not possible for cold nitrogen gas to boil-off through this tube so that, after some time, it becomes significantly warmer than the other two tubes. In this fashion the above described transverse displacements of the central helium vessel relative to the room temperature bore of the cryostat, normally occur.

Because of the symmetry and the strength of the steel suspension tubes in the vertical direction, those of skill in the art were of the opinion that it is not possible for geometrical displacement to occur while cooling down the cryostat. In contrast, it is the purpose of the present invention to modify a conventional cryostat with as simple means as possible to avoid, during cooling of the cryostat, the above described horizontal displacement of the cryomagnet containing a central vessel due to a tilting of the shell filled with a second cryogenic fluid and surrounding the central vessel, said tilting being transferred to the central vessel.

SUMMARY OF THE INVENTION

This purpose is achieved in accordance with the invention by surprisingly simple, as well as equally effective and economical means, in that the good thermally conducting tube-shaped connecting elements are configured to be mechanically flexible. The problem described above which, up to this time, has not been properly recognized by those of skill in the art, does not lie in the mechanical rigidity and reliability of the connecting elements, which had already been achieved in the art, but rather in the transfer of mechanical forces from the liquid nitrogen vessel via the known rigid connecting elements onto the central helium vessel. This problem is avoided in an elegant fashion by the mechanically flexible configuration of the connecting elements in accordance with the invention. In contrast to the suspension tubes and the coupling of the intermediate radiation shields, it is not necessary for the thermal contact between the liquid nitrogen vessel and the helium exhaust tube to carry anything other than its own weight.

In a preferred embodiment the connecting element tubes are made from a good thermally conducting metal, for example, copper with, preferentially, a cylindrical cross-section which is equipped with slits around its circumference. This has the advantage that the connecting elements function simultaneously as radiation shields which surround the exhaust tube on all sides from the contact location down, and which shield the exhaust tube from the temperature of the liquid nitrogen in the nitrogen vessel.

In a particularly preferred improvement of this embodiment, the slits are shaped as spiral helixes around the circumference of the tubes. Starting with a cylindrically shaped tube configuration which, due to its geometric shape, is already well suited for use with the generally cylindrically shaped contact surface of the helium exhaust tube, a spring-like effect is achieved through a spiral-shaped slitting, easily machined into a cylindrically shaped tube, around the circumference, the spring-like effect causing a strong reduction in the transfer of horizontal as well as vertical forces. The thermal resistance of this type of connecting element is somewhat increased by the spiral shaped cut. This is, however of no great consequence since this thermal resistance is already significantly smaller than the thermal resistance of the contact itself. In this embodiment, the shape of the contact elements can be produced, simply and economically from a cylindrically shaped tube (for example, from copper) which can be brought into the desired form by means of special pressure shaping techniques.

In another likewise very simple and economical manufacturing procedure, the slits are provided essentially parallel to the lengthwise axis of the tubes. By means of these lengthwise slits the tubes become flexible in the horizontal direction transverse to their lengthwise axis.

In an improvement of this embodiment the slits extend at least one half of the axial extent of the tubes. A particularly high displacement capability and flexibility of the connecting elements in a direction transverse to the axis is achieved by using the long slits.

One disadvantage of this embodiment is the strong increase in the thermal resistance of the connecting elements, due to the large axial extent of the slits, whereby their effectiveness as radiation shields is reduced. This disadvantage is avoided in an embodiment with which the slits exhibit a small length in respect to the axial length of the tubes.

In an improvement of this embodiment, a plurality of mutually adjacent slits are provided in the circumferencial as well as in the axial direction in order to regain the losses in flexibility of the tubes which thereby result.

In embodiments of the invention, the tube is provided with slits in a direction which is transverse to the lengthwise axis of the tubes in order to also achieve flexibility in the axial direction.

The advantages and disadvantages of the above described embodiments are reflected in a further embodiment in which cross-shaped and/or X-shaped slits are provided on the tubes.

Another possibility for realizing flexible tube-shaped connecting elements is to utilize flexible bands, for example, bands woven from copper filaments. These soft band structures can easily bulge outwards when the liquid nitrogen vessel is displaced in any direction.

In another embodiment of the invention, the tube-shaped connecting elements are flexible only over a certain region of their axial extent, preferably in the middle region between the two ends of the tube. In this manner it is possible to achieve good heat transfer by configuring the connecting element contact locations to be in close, rigid contact with the holding means or with the shell surrounding the central vessel, without limiting the flexibility of the connecting elements so that they still fulfill their purpose of mechanically decoupling the movement of the outer shell from the holding means of the central vessel.

In a preferred embodiment the tube-shaped connecting elements exhibit differing diameters along their axial lengths. In this manner it is possible, to adapt the connecting elements to the shape and configuration of the holding means whole adjusting to the geometry of the shell surrounding the central vessel.

In an improvement of this embodiment, the tube-shaped connecting elements exhibit a narrow cross-section at the end in thermal contact with the holding means, and are radially wider at an axial distance from the contact locations. In this manner it is possible to secure the function of the connecting elements as intermediate radiation shields.

This goal is also served by an embodiment in which the tube-shaped connecting elements exhibit a rigid collar at the location of contact to the connecting means, the collar being ring-shaped, rigid, and tightly surrounding the connecting means and is preferentially comprised of copper or aluminium to which the remaining parts of the connecting elements, in particular the flexible part, are thermally well connected. With this embodiment it is possible to effect a good heat transfer between the connecting elements and the holding means.

The tube-shaped connecting elements can achieve an auxiliary purpose as intermediate radiations shields in an embodiment in which they completely surround, without touching, the holding means at the contact locations and extend along an axial length from the contact location towards the central vessel.

The invention is described and explained more closely below in connection with the embodiments represented in the drawing. The features which can be derived from the description and the drawing can be applied individually or collectively in an arbitary combination to the other embodiments of the invention.

BRIEF DESCRIPTION OF THE DRAWING

FIG. 1a shows a schematic vertical cut through a section of a cryostat in accordance with the invention;

FIG. 1b shows a connecting element with a spiral helix shaped slit around its circumference;

FIG. 3a shows a slit geometry for the connecting elements in which the slits exhibit long parallel lines coaxial to the connecting element;

FIG. 3b exhibits a geometry for the connecting elements in which the slits exhibit broken parallel coaxially running lines;

FIG. 3c shows a slit geometry similar to FIG. 3b except the slits are staggered in the vertical direction;

FIG. 3d shows a slit geometry including axial and transverse slits;

FIG. 3e displays a slit geometry for the connecting elements in which axially running parallel rows of slits are separated by a row of transverse running slits;

FIG. 3f shows a slit geometry configuration exhibiting a cross-shape structure; and FIG. 3g exhibits a slit geometry having an "X" shape.

DESCRIPTION OF THE PREFERRED EMBODIMENT

Figure 2:
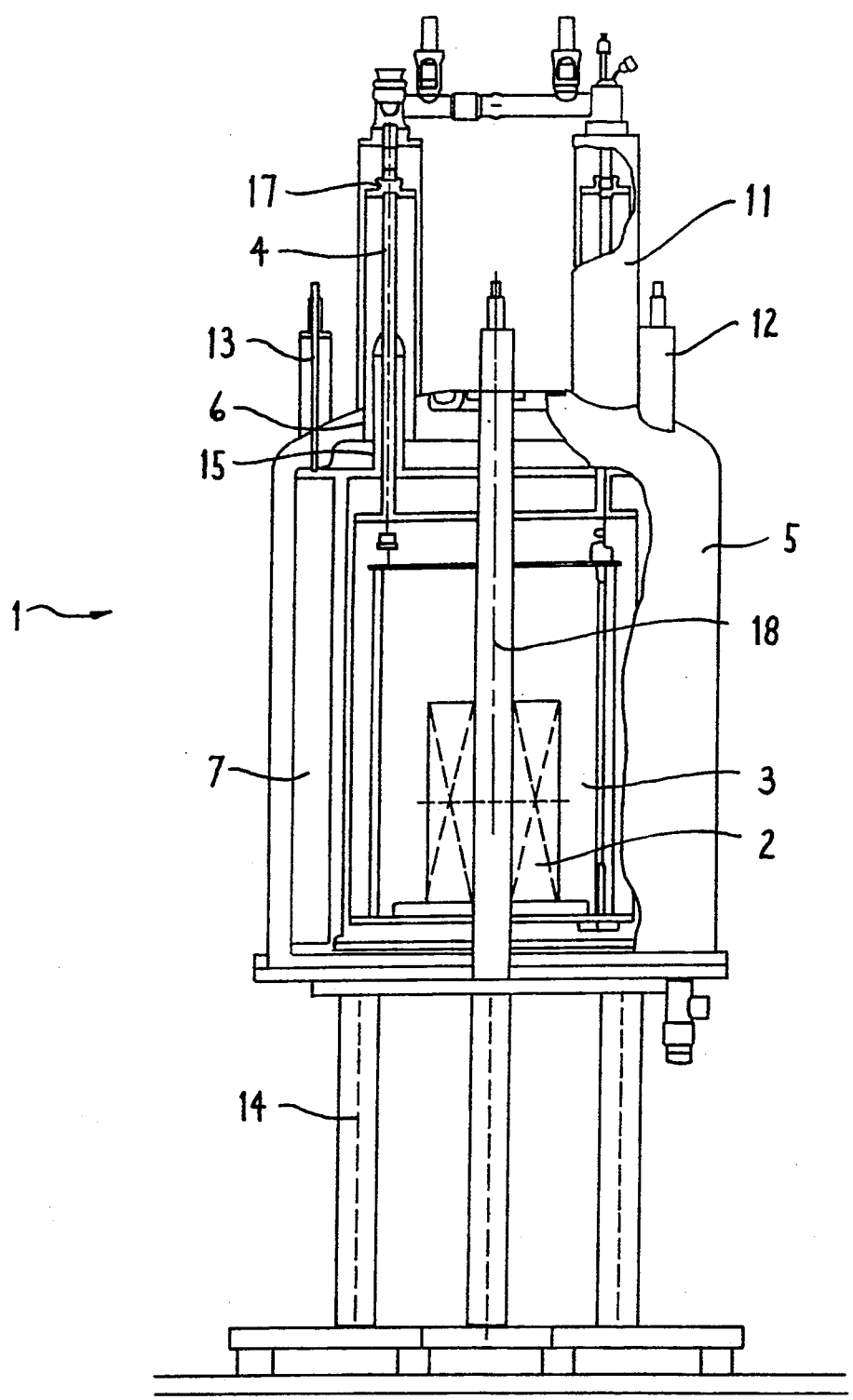
FIG. 2 shows a schematic partially closed vertical cut view of a cryostat for NMR-magnets according to prior art.

The cryostat 1 shown in FIG. 2 of the prior art is particularly suited for accepting a superconducting magnet coil 2 for nuclear spin resonance (NMR) measurements. It is supported by a three-legged frame 14 and is surrounded by a metallic outer jacket 5. The superconducting magnet coil 2 is stored in a central vessel 3 which is filled with liquid helium for cooling the magnet coil 2.

In order to achieve as small a thermal contact with the outside world as possible, the central vessel 3 is suspended at the inside Of the outer jacket 5 by means of holding means 4 which simultaneously serve as fill and exhaust tubes for the liquid helium. The helium boiling off from the central vessel 3 initially delivers its remaining enthalpy along the path through the exhaust tube 4 via the tube wall to a good thermally conducting radiation shield attached thereto 15, which lies at a temperature between the boiling point of helium and the boiling point of nitrogen. Further along its path through the outer jacket's 5 helium exhaust tower 11, which surrounds the exhaust tube 4 on all sides of the escaping helium gas arrives at a contact location 17 provided for in the vicinity of the upper side of the tower 11, the contact location 17 being in thermal contact with a liquid nitrogen containing vessel 7 encapsuling the central vessel 3 by means of a connecting element 6 which, according to prior art, is configured as a rigid tube surrounding the helium exhaust tube 4. The exhaust tube 4 and the boiled-off helium therein have approximately the boiling temperature of liquid nitrogen at contact location 17.

The connecting element 6 thereby serves, the function of a radiation shield or the lower part of the helium exhaust tube 4 which it surrounds, thereby shielding temperatures higher than the temperature of liquid nitrogen from large portions of the helium exhaust tube 4. In the last short stretch up to the suspension of the helium exhaust tube 4 in the helium exhaust tower 11, the escaping boiled-off helium finally warms itself from the temperature of liquid nitrogen to approximately room temperature of the atmosphere surrounding the cryostat 1, thereby releasing its remaining enthalpy via the outer wall of the helium exhaust tube 4 to the inner side of the outer jacket 5 and partially also to the surrounding air.

The shell-shaped liquid nitrogen vessel 7, similar to the central vessel 3, is suspended from the outer jacket 5 via steel tubes 13 which are surrounded by the nitrogen exhaust towers 12 in the outer jacket 5. The NMR magnet cryostats 1 known in the art are typically equipped with three nitrogen exhaust towers 12 and two helium exhaust towers 11.

Modern cryostats 1 of this type work with extremely small helium loss rates on the order of magnitude of 10 ml/h ("low loss"), with which they are able to achieve retention times of over one year.

The NMR magnet coils which are accepted by these cryostats can produce magnetic fields of 2 to 15 Tesla with a stability of $10^{-8}/h$ (maximum field drift). The homogeneity of this type of magnetic field for high resolution NMR spectroscopy assumes a value, at this time, of between $10^{-8}$ to $10^{-10}$ under utilization of shim-coils in the room temperature region which serve to compensate small field errors in the main magnetic field. The higher homogeneity value of approximately $10^{-10}$ is, in practice, achieved with measuring samples of approximately 5 mm in diameter and approximately 8 mm in length.

As discussed above, through an uneven cooling down of the steel tubes 13 through which the liquid nitrogen is introduced into the vessel 7, or through boiled-off nitrogen removed from the vessel 7, mechanical stresses due to differing thermally caused contractions of the steel tubes 13 can occur, leading to a tipping or to a horizontal displacement of the liquid nitrogen vessel 7 from its original position. This type of uneven cooling is to be expected since, for safety reasons, an overpressure valve is permanently provided for in one of the three steel tubes 13 through which no liquid helium flows so that this steel tube 13 is already warmer than the two others during the filling up phase of the liquid nitrogen vessel 7.

By means of the mechanically rigid thermal contact connecting elements 6 between the liquid nitrogen vessel 7 and the helium exhaust tube 4 of the prior art, a tilting motion or sidewards displacement of the liquid nitrogen vessel 7 is mechanically transferred via the exhaust tube 4, serving as a holding means, onto the central vessel 3 filled with liquid helium and containing the NMR magnet coil 2. This leads to a displacement of the magnet coil 2 and consequently of the magnetic field thereby produced relative to the NMR measurement sample located in a central room temperature bore 18 through the cryostat 1 (not shown in the drawing). In this manner, the above mentioned high homogeneity of the NMR magnetic field, as well as its sidewards stability, is compromised and a "further shimming" of the field is necessary as soon as a stable mechanical geometry of the cryostat components once more obtained.

In order to avoid such a relative field shifting, the connecting elements 6, in accordance with the invention, are mechanically flexible in order to mechanically decouple possible movement of the liquid nitrogen vessel 7 from the central vessel 3, and thereby from the magnetic coil 2.

FIG. 1a shows a lengthwise cut through the cryostat 1 illustrating a helium exhaust tower 11 and a nitrogen exhaust tower 12 as well as the elements contained therein. Particularly important for the invention is the mechanically flexible configured tube-shaped connecting element 6 which can be made from a good-conducting material, such as copper.

In the embodiment shown in FIG. 1b, the connecting element 6 obtains its flexibility by means of a spiral helix-shaped slit 8 around the circumference of the tube 16. As indicated in the drawing, the slit 8 extends only in one particularly confined axial region 10 along the length of the connecting elements 6 which lies preferentially approximately in the middle between the tube ends of the tube 16. Only in this region 10 does the connecting element 6 exhibit the necessary mechanical flexibility in order to achieve the purpose of the invention. This, however, is sufficient to achieve the desired mechanical decoupling of the motion of the nitrogen vessel 7 from the central vessel 3.

The connecting element 6 shown in FIG. 1b, exhibits differing diameters along its lengthwise axis 26. In particular, the tube 16 has a narrow cross section at the helium exhaust tube 4 contact location 17 and, at an axial separation from the contact location 17, is radially widened in order to avoid touching the helium exhaust tube 4 and to function as a radiation shield.

In order to produce a particularly good thermal contact to the helium exhaust tube 4, the connecting element 6 exhibits at the contact location 17 a rigid ring-shaped collar 9 which closely surrounds the helium exhaust tube 4 and which is preferentially made from copper or aluminium and can be an integral part of the tube 16 at its tapered location. The collar 9 can also be configured as a stand-alone piece, whereby one must be careful to achieve a very good thermal connection to the tube 16 which carries the flexible part 10 of the connecting element 6.

Instead of the embodiment shown in FIG. 1b of the connecting element 6 with a helical slit 8, other slit forms are possible as schematically shown in FIG. 3. FIG. 3a shows a connecting element 6 having a slit 8' which is largely parallel to the lengthwise axis 26 of the tube 16. In the embodiment according to FIG. 3a, the slits are relatively long compared to the length of the tube in order to achieve a higher flexibility of the connecting elements 6 in a direction transverse to the lengthwise axis 26.

FIG. 3b also shows lengthwise slits 8' which however exhibit a length which is small relative to the axial extent of the tube 16. The same is true for the slits 8' in the embodiment according to FIG. 3c. In each case a plurality of slits 8' are provided both next to each other in the circumferential direction as well as below one another in the axial direction of the tube 16 in order to compensate, due to the reduced slit length, for the reduced flexibility of the connecting element 6 compared to the embodiment according to FIG. 3a. An advantage of the embodiment according to FIG. 3b and 3a is the somewhat increased heat conductivity of the corresponding tube 16. Due to the differing configuration of the lengthwise slits 8' in the embodiments according to FIG. 3b and 3c, it is possible to tailor the mechanical properties of the tube 16, in particular, the response to tension and torsion forces.

As shown in FIG. 3d and 3e the tubes 16 can, in addition to the lengthwise slits 8', also exhibit transverse slits 8'' in a direction transverse to the lengthwise axis 26 to facilitate a stretching or compression of the tube 16 along the lengthwise axis 26. The relative configuration of lengthwise slits 8' and transverse slits 8'' can likewise be chosen differently than shown in FIGS. 3d and 3e in order to achieve differing mechanical properties of the corresponding tube 16.

Finally cross-shaped slits 8''', as shown in FIG. 3f, and X-shaped slits 8'''', as shown in FIG. 3g, can be used. In addition there are an arbitrary number of other conceivable slit geometries which cannot be presented in detail here.

In another embodiment not shown in the drawings, the tube-shaped connecting elements 6 possess flexible bands which, by way of example, can comprise woven copper filaments. These flexible bands are, at one end of the connecting element 6 and are, preferentially in good thermal contact with rigid collar 9 in order to produce as good a heat transfer as possible to the holding means 4. A rigid contact collar is also recommended at the other end where the connecting element 6 is in contact with the liquid nitrogen vessel 7, which can, for example, correspond to the flange 19 provided for on tube 16 shown in FIG. 1a. The flexible band connecting elements 6 have the advantage of total mechanical decoupling of the central vessel 3 from the shell-like liquid nitrogen vessel 7 surrounding the central vessel 3 since the flexible bands bulge and deform to completely absorb all relative motion. A disadvantage of this embodiment is that the function of the connecting elements 6 as radiation shields is compromised.

In a specific embodiment, the outer diameter of the outer jacket 5 assumes a value of 670 mm, the nitrogen exhaust tower 12 lies on a partial circle about the middle axis of the cryostat 1 with a diameter of 550 mm, the helium exhaust tower 11 lies on a partial circle with a diameter of 330 mm and has a height of approximately 390 mm; the height of the steel tubes 13, measured from the upper end of the liquid nitrogen vessel 7, assumes a value of 270 mm; the distance of the upper edge of the connecting element 6 from the upper side of the liquid nitrogen vessel 7 assumes a value of 315 mm and the separation of the flange 19 from the upper side of the liquid nitrogen vessel 7 assumes a value of 43 mm.

The connecting element 7 as shown in the embodiment according to FIG. 1b can be comprised from a tube which narrows towards the top with a total height of 275 mm and a maximum outer diameter of 60 mm, whereby the shown spiral helix shaped slit 8 exhibits an axial extent of 82 mm and a slit width of 4 mm.

The cryostat 1 in the embodiment has three equally long steel tubes 13 to exhaust liquid nitrogen exhibiting, at their lower side, a temperature of 77° Kelvin. On their upper side, the temperatures can be different: the nitrogen exhaust tube having the safety valve exhibits the ambient temperature at its upper side (approximately 290° Kelvin) whereas the temperature of the other tubes is approximately 210° Kelvin. The temperature dependence of the steel tube 13 should, in any event, be linear. The length difference between the valved steel tube 13 and the two other non-valved steel tubes is approximately 0.17 mm. Under the approximation that the helium vessel 3 together with its two corresponding exhaust tubes 4 were not present, the position of the contact location 17 would experience a horizontal displacement of approximately 0.11 mm. Including the helium vessel, this value should be somewhat smaller. These statements, however, are simply rough estimates and an exact calculation of the actual horizontal displacement would be extremely difficult.

The displacement value of 0.11 mm may, at first glance, seem very small. One, however, must thereby consider that, in high resolution NMR spectroscopy, as mentioned above, field homogenties of $10^{-9}$ to $10^{-10}$ are required. The cryomagnet itself delivers a field homogeneity of $10^{-6}$ to $10^{-7}$ within a sample tube of 5 mm diameter. The remaining three orders of magnitude must be achieved using room temperature-shims. The resulting homogeneity must therefore, on the one hand, be very high but, on the other hand, is dependent on two systems which can not be rigidly connected to each other. These two facts, taken together, lead to the problem that even the smallest relative displacements between the magnet system and the shim system can cause intolerable field inhomogeneities. The present invention offers a solution for this problem.

We claim:

1. A cryostat for the acceptance of a superconducting magnet coil with a central vessel, for containing a first cryogenic liquid, which is mechanically connected to an inner side of a closed outer jacket of the cryostat via a holding means, the holding means having a contact location to a tube-shaped connecting element and being, via the tube-shaped connecting element, in good thermal contact with a shell surrounding the central vessel, the shell being maintained at the temperature of a second cryogenic liquid whose boiling temperature is higher than the boiling temperature of the first cryogenic liquid, wherein the tube-shaped connecting element is a hollow cylinder provided with slits around its circumference.

2. The cryostat of claim 1, wherein the slits form spiral helix shapes around the circumference of the tube-shaped connecting element.

3. The cryostat of claim 1, wherein the slits are adapted to be largely parallel to a lengthwise axis of the tube-shaped connecting element.

4. The cryostat of claim 3, wherein the slits are of a length which is at least half an axial length of the tube-shaped connecting element.

5. The cryostat of claim 3, wherein the slits are of a length which is small compared to an axial length of the tube-shaped connecting element.

6. The cryostat of claim 5, wherein the slits are spaced around a girth of the tube-shaped connecting element and are positioned in axial alignment with each other.

7. The cryostat of claim 3, further comprising horizontal slits which extend in a direction transverse to the lengthswise axis of the tube-shaped connecting element.

8. The cryostat of claim 2, wherein said slits are cross-shaped.

9. The cryostat of claim 1, wherein the tube-shaped connecting element is flexible only over a limited part of its axial length.

10. The cryostat of claim 1, wherein the tube-shaped connecting element has a changing diameter along its axial length.

11. The cryostat of claim 10, wherein the tube-shaped connecting element has a narrowed cross-section at an end at which it is in thermal contact with the holding means, and is radially widened at an axial separation from this end.

12. The cryostat of claim 1, wherein the tube-shaped connecting element, at the contact location, comprises a rigid ring-shaped collar which tightly surrounds the holding means, the collar being in good thermal contact with the tube-shaped connecting element.

13. The cryostat of claim 1, wherein the tube-shaped connecting element completely encloses the holding means over an axial length of the holding means extending in a direction from the contact location towards the central vessel, and, except at the contact location, does not touch the holding means.

14. The cryostat of claim 1, wherein said slits are X-shaped.

* * * * *

UNITED STATES PATENT AND TRADEMARK OFFICE
CERTIFICATE OF CORRECTION

PATENT NO. : 5 404 726
DATED : April 11, 1995
INVENTOR(S) : Volker JANSSEN

It is certified that error appears in the above-indentified patent and that said Letters Patent is hereby corrected as shown below:

Column 10, line 4; change "2" to ---1---.

Signed and Sealed this

Fifteenth Day of August, 1995

Attest:

BRUCE LEHMAN

Attesting Officer　　　Commissioner of Patents and Trademarks